(12) United States Patent
Burr et al.

(10) Patent No.: US 8,110,806 B2
(45) Date of Patent: Feb. 7, 2012

(54) SOLID-STATE PHOTOMULTIPLIER HAVING IMPROVED TIMING RESOLUTION

(75) Inventors: Kent Charles Burr, Mayfield Village, OH (US); Gin-Chung Jimmy Wang, Niskayuna, NY (US); Aaron Judy Couture, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 487 days.

(21) Appl. No.: 12/262,222

(22) Filed: Oct. 31, 2008

(65) Prior Publication Data

US 2010/0108900 A1    May 6, 2010

(51) Int. Cl.
    *G01T 1/20* (2006.01)
(52) U.S. Cl. .......... 250/370.01; 250/370.08; 250/370.09
(58) Field of Classification Search .............. 250/370.01, 250/370.08, 370.09
    See application file for complete search history.

(56) References Cited

U.S. PATENT DOCUMENTS

| | | | | |
|---|---|---|---|---|
| 4,334,239 A | * | 6/1982 | Herbst et al. | 348/274 |
| 4,586,068 A | | 4/1986 | Petroff et al. | |
| 4,907,054 A | * | 3/1990 | Berger | 257/443 |
| 5,565,676 A | * | 10/1996 | Tanabe et al. | 250/340 |
| 6,781,133 B2 | | 8/2004 | Karplus et al. | |
| 7,193,208 B1 | * | 3/2007 | Burr et al. | 250/300 |
| 2009/0095887 A1 | * | 4/2009 | Saveliev | 250/214 R |

FOREIGN PATENT DOCUMENTS

WO    2006111883 A2    10/2006

OTHER PUBLICATIONS

Stapels et al.; "Solid-State Photomultiplier in CMOS Technology for Gamma-Ray Detection and Imaging Applications"; Nuclear Science Symposium Conference Record, 2005 IEEE; Oct. 23-29, 2005; vol. 5, on pp. 2775- 2779.
Piemonte et al.; "Characterization of the First Prototypes of Silicon Photomultiplier Fabricated at ITC-irst"; IEEE Transactions on Nuclear Science, vol. 54, No. 1, Feb. 2007; on pp. 236-244.

* cited by examiner

*Primary Examiner* — David Porta
*Assistant Examiner* — Christine Sung
(74) *Attorney, Agent, or Firm* — Jason K. Klindtworth (57) ABSTRACT

A solid-state photomultiplier is provided for use in imaging detectors. The solid-state photomultiplier includes a plurality of microcells configured to detect impinging photons. Each of the plurality of microcells further includes a photodiode coupled to a common electrode through a quenching resistor and configured to convert the impinging photons into electrical signals, and an impedance device coupled in parallel with the quenching resistor so as to reduce overall quenching impedance at high frequency. Further, techniques are provided for implementing low impedance device with controllable value to the SSPM for optimized timing resolution.

20 Claims, 7 Drawing Sheets

SOLID-STATE PHOTOMULTIPLIER HAVING IMPROVED TIMING RESOLUTION

BACKGROUND

The invention relates generally to solid-state photomultipliers, and more particularly to techniques for improving timing performance of solid-state photomultipliers.

A solid-state photomultiplier (SSPM) is a photosensor consisting of an array of photodiodes that are connected in parallel and operated above their breakdown voltage in so-called Geiger mode. SSPMs provide many advantages over conventional photomultiplier tubes (PMTs) and are therefore being used in many applications. These advantages include better photon detection efficiency (high probability of detecting an impinging photon), compactness, ruggedness, low operational voltage, insensitivity to magnetic fields and low cost.

However, current SSPMs generally have slower single-photon response. Even though they may have significantly higher photon detection efficiency than do PMTs (~50% vs. 25%), SSPMs generally have inferior timing resolution compared to fast PMTs. In a standard SSPM, the single-photon response (i.e. impulse response) is approximated by an exponential function, with the decay time given by the RC time constant of the quenching resistor and the diode capacitance. Since these time constants are usually on the order of tens to hundreds of nanoseconds, the single-photon response of an SSPM is much slower than the single-photon response of a PMT designed for timing applications. Thus, for applications that require precise timing measurements, such as time-of-flight PET, SSPMs have potential limitations.

It is therefore desirable to provide an efficient SSPM with improved timing resolution.

BRIEF DESCRIPTION

Briefly, in accordance with one aspect of the technique, a solid-state photomultiplier is provided. The solid-state photomultiplier includes a plurality of microcells configured to detect impinging photons. Each of the plurality of microcells includes a photodiode coupled to a common electrode through a quenching resistor and configured to convert the impinging photons into electrical signals, and an impedance device coupled in parallel with the quenching resistor so as to reduce overall quenching impedance at high frequency.

In accordance with another aspect of the technique, a method of manufacturing a solid-state photomultiplier is provided. The method provides for fabricating a plurality of microcells. Each microcell includes a photodiode coupled to a common electrode through a quenching resistor. The method also provides for fabricating an impedance device in parallel with the quenching resistor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
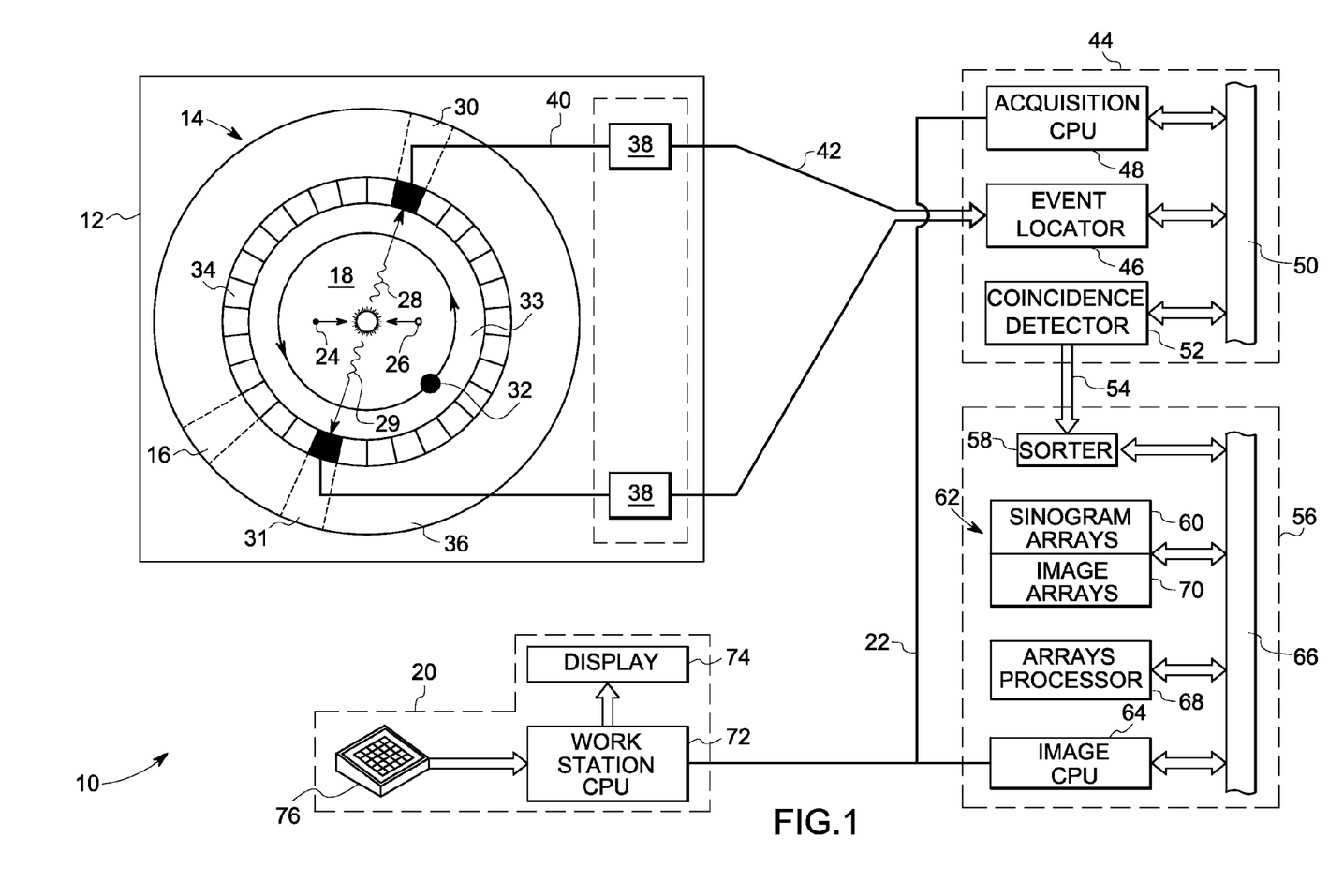
FIG. 1 depicts an exemplary time of flight PET imaging system for volumetric imaging using a detector ring in which aspects of the present technique may be practiced.

Referring now to FIG. 1, an imaging system 10 for acquiring and processing image data is illustrated. In the illustrated embodiment, the imaging system 10 is a time-of-flight PET system designed both to acquire original image data and to process the image data for display and analysis in accordance with the present technique. The PET imaging system 10 is illustrated with a gantry 12 that supports a cylindrical detector ring assembly 14, comprising of an array of detectors 16 (detector units), about a central aperture (imaging volume) 18. The detectors 16 may be shielded from radiation from outside the field of view by lead end-shields (not shown). The detector ring assembly 14 generally forms a complete ring about the imaging volume 18. In one implementation, the gantry 12 may rotate through a small angle about the imaging volume 18 to average out gaps between the detectors 16.

A patient table may be positioned within the aperture 18 of the PET system 10. The patient table is adapted so that a patient may recline comfortably during the examination process. A patient table controller (not shown) moves the patient table into the imaging volume 18 in response to commands received from an operator workstation 20 through a communication link 22 such as a local area network (LAN). Additionally, a gantry controller (not shown) may be configured to receive commands from the operator workstation 20 through the communication link 22 to operate the gantry 12.

The patient is commonly injected with a biologically active radioactive tracer. This radioactive substance has two parts called a carrier such as glucose, which concentrates in parts of the body with increased metabolic activity, and the radionuclide, which emits a positron 24. Since carbon, nitrogen, oxygen, and fluorine atoms occur naturally in many compounds of biological interest, positron emitting isotopes of such atoms (radionuclides) may be synthesized and readily incorporated into a wide variety of useful radio-pharmaceuticals. The type of tracer a patient receives depends on the area of the body to be viewed. The most commonly used tracers are radiolabeled glucose, ammonia, and water, all of which are found in the human body. As the tracers are short-lived, the radiation exposure a patient receives is small. The tracer is allowed to dwell in the patient for a time such that its distribution is determined by the biological function to be imaged.

The radioactive decay of the tracer emits a positron 24 that annihilates with electrons 26 in the body of the patient. This annihilation produces two high energy (about 511 KeV) photons 28, 29 propagating in nearly opposite directions (about 180 degrees apart) that are in coincidence. These photons 28, 29 are detected by the detector ring assembly 14 surrounding the patient. When a detector 30 detects a photon 28 from an annihilation event, the detector 31 opposite it looks for a matching photon 29. If two matching photons 28, 29 are recorded within a short timing window (e.g., nanoseconds) of each other (also referred to as a coincidence timing window), the detectors 30, 31 register a coincidence event (called a true coincidence if neither photon 28, 29 is scattered) along the line connecting the two detectors 30, 31 also known as a line of response.

The PET system 10 may then draw lines of responses between each detector pair such as those indicated by reference numeral 30 and 31 registering a coincidence event during a scan. Summing many such events results in quantities that approximate line integrals through the radioisotope distribution. The higher the number of coincidences detected, the more precise this calculation will be. The system 10 then uses this information to construct an image of the radioisotope distribution, using algorithms similar to those applied in CT, MR and nuclear medicine, thereby yielding quantitative estimates of the concentration of the radiopharmaceuticals at specific locations within the body. For a good reconstruction, an attenuation map of the patient may be used in order to correct for attenuation of the gamma rays or x-rays within the patient. In one implementation, the attenuation map may be obtained by rotating a radioactive source such as Cs 137 around the patient and measuring the attenuation along each line of response. Alternatively, a CT scan may be used to generate the attenuation map as in PET-CT system. The reconstructed images are cross-sectional slices that highlight areas of biochemical activity. While other diagnostic tests, such as x-rays, CT scans, MR scans or ultrasound, provide cross-sectional images of the body structure showing bones, tissue and organs, the PET scan can provide images of physiological activity giving information on the chemistry and function of the area under examination.

As illustrated in FIG. 1, each detector ring of the detector ring assembly 14 may comprise of a rod source 32 used for attenuation correction, a septa 33 used for scatter reduction, and a plurality of detector units 16 consisting of scintillator elements 34 and solid-state photomultipliers 36 (SSPMs). A plurality of acquisition circuits 38 may receive analog signals 40 from the detector units 16 and produce digital signals 42 indicating the event coordinates and the total energy. Each acquisition circuit 38 may also produce an event detection pulse, which indicates the moment the scintillation event took place. The digital signals 42 from the acquisition circuits 38 are then processed by a data acquisition system 44 (DAS).

The data acquisition system 44 may include an event locator 46 that periodically samples the digital signals 42 produced by the acquisition circuits 38. The data acquisition system 44 also includes an acquisition processor 48 that controls the communication link 22 and a data bus 50 (backplane bus). The event locator 46 may assemble the information regarding each valid event into an event data packet that indicates when the event took place and the position of the detector 16 that detected the event. This event data pack is conveyed to a coincidence detector 52, which may be a part of the data acquisition system 44.

The coincidence detector 52 may receive the event data packets from the event locators 46 and determine if any two of them are in coincidence. Coincidence is determined by a number of factors. First, the time markers in each event data packets may be within a specified time window of each other. Second, the locations indicated by the two event data packets may lie between a pair of detectors, such as those indicated by reference numeral 30 and 31, which may have a line of response that passes through the field of view in the imaging volume 18. Events that cannot be paired as such are discarded, but coincident event pairs are located and recorded as a coincidence data packet that is conveyed through a link 54 to an image reconstructor 56.

The image reconstructor 56 may include a sorter 58 that counts events occurring along each projection ray and organizes them into a two-dimensional sinogram array 60 that may be stored in a memory module 62. The image reconstructor 56 also includes an image processor 64 that controls a data bus 66 and links the image reconstructor 56 to the communication link 22. An array processor 68 also connects to the data bus 66 and it may reconstruct images from the sinogram arrays 60. A resulting image array 70 may be stored in the memory module 62 and output by the processor 64 to the operator workstation 20.

The operator workstation 20 may include a workstation processor 72, a display unit 74 and an input device 76. The workstation processor 72 may connect to the communication link 22. The operator may control the calibration of the PET scanner 10, its configuration, positioning of the patient table for a scan and the gantry 12 through operator workstation 20. The operator may also control the display of the resulting image on the display unit 74 and perform image enhancement functions using programs executed by the workstation processor 72. It should be noted that the operator workstation 20 may be coupled to other output devices such as printers, standard or special purpose computer monitors, associated processing circuitry or the like. One or more operator workstations 20 may be further linked in the imaging system 10 for outputting system parameters, requesting examinations, viewing images, and so forth.

Figure 2:
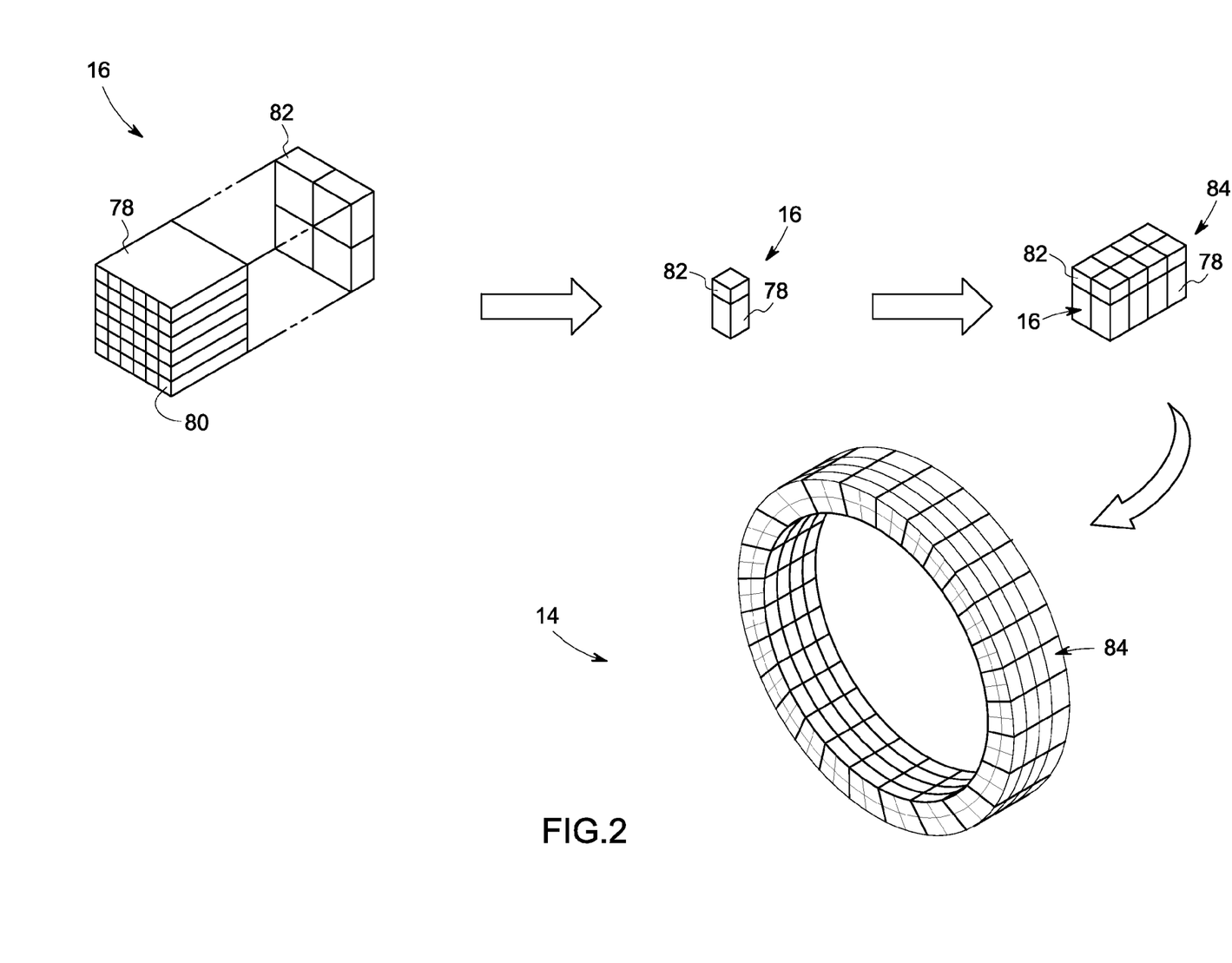
FIG. 2 depicts assembly of a detector ring using an array of detector units in which aspects of the present technique may be practiced.

The exemplary imaging system 10, as well as other imaging systems based on radiation detection, may employ detectors 16 to detect the intensity of radiation 28, 29 transmitted through the imaging volume 18 and to generate a detector output signal in response to the detected radiation 28, 29. Referring now to FIG. 2, an exemplary embodiment for assembling the detector ring assembly 14 for use in the PET system 10 is depicted. In the depicted embodiment, a plurality of detector units 16 is assembled to form the detector ring assembly 14.

Each detector unit 16 includes a scintillator block 78, comprising one or more scintillator elements 80, that are optically coupled to one or more SSPMs 82. When a photon interacts in the scintillator element 80, electrons are moved from valence band to the conduction band. These electrons return to the valence band in the scintillator element 80, thereby emitting photons in the process. Because the impurities usually have metastable excited states, the photon output decays exponentially at a rate characteristic of the scintillator element 80. The ideal scintillator element 80 has high density and high atomic number so that a large fraction of incident photons scintillate. The ideal scintillator element 80 also generates a high photon output for each absorbed photon. This may result in better positioning accuracy and energy resolution. The ideal scintillator element also has a fast rise-time for accurate timing and a short decay time for handling high counting rates. For example, Cerium doped Lutetium Yttrium Orthosilicate (LYSO) crystals, which generate approximately 15000 light photons per 511 KeV photon and have a decay time of about 40 ns, may be used as a scintillator elements 80 to form the scintillator block 78. In one implementation, a matrix of 36 LYSO crystals (6×6 array of LYSO crystals) is coupled to an SSPM array where each crystal is about 6.3 mm wide in the transverse plane, about 6.3 mm wide in the axial dimension, and about 30 mm deep, to form the detector unit 16. A group of detector units 16 is then assembled to form a detector module 84 and a group of detector module 84 is assembled to form the detector ring assembly 14. In one implementation, 8 detector units 16 are assembled to form the detector module 84 and 35 such detector modules 84 are assembled to form the detector ring assembly 14.

All of the SSPMs 82 may produce analog signals when a scintillation event occurs at the scintillator block 78. The scintillator block 78 is fabricated in such a way that the amount of photons collected by each SSPM 82 varies uniquely depending on the crystal 80 in which the scintillation occurred. Hence, integrals of SSPM outputs can be decoded to yield the position of each scintillation. The sum of the integrated SSPM outputs is proportional to the energy deposited in the scintillator block 78.

Figure 3:
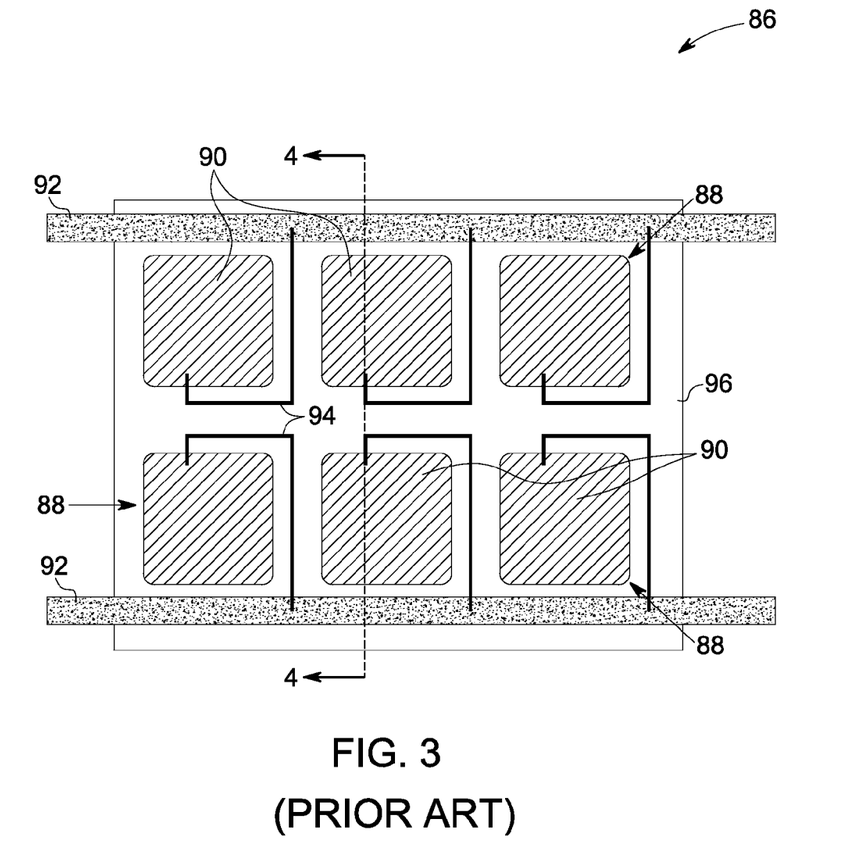
FIG. 3 depicts a top view of a generic solid-state photomultiplier.

FIG. 3 depicts a top view of a generic SSPM 86. The generic SSPM 86 includes a plurality of microcells 88 for detecting impinging photons coming from the scintillator block 78. Each of the microcells is substantially identical to other microcells and is typically 20-100 microns long. Each of the plurality of microcells 88 further includes a photodiode 90, such as an avalanche photodiode (APD), coupled to a common electrode 92 through a quenching resistor 94 and is configured to convert the impinging photons into electrical signals. In certain embodiments, each SSPM includes 100 to 2500 avalanche photodiodes (APDs) per square millimeter. The APDs are operated a few volts above their breakdown voltage in so-called Geiger mode. In this mode of operation, an electron generated by the absorption of an optical photon initiates an avalanche breakdown that is confined to an individual microcell 88 when the one or more photons are absorbed by that microcell. A single discrete unit of electrical charge is emitted from the microcell 88 independent of the number of photons absorbed therein. That is, for each Geiger breakdown, the output signal of the microcell 88 will have the substantially similar shape and charge. The small variations are typically due to differences from cell to cell introduced in the production process. By analyzing these electrical signals, the number of optical photons and their energy is determined for subsequent processing. The position of the gamma ray or x-ray interaction in the scintillator block 78 may be determined from a centroid calculation based on the relative amplitudes of the signals recorded on the SSPMs 82. Alternately, the position can also be determined by reading out individual SSPM pixel to which scintillator crystals are individually coupled.

Figure 4:
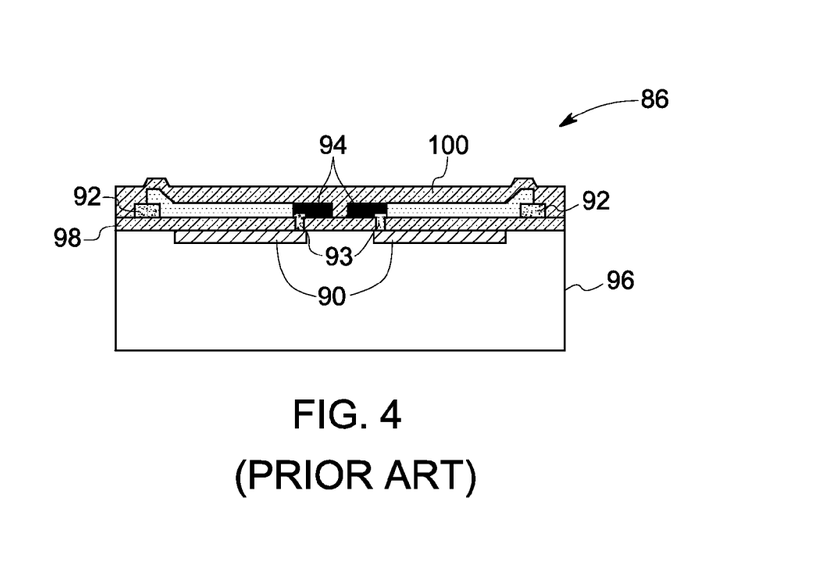
FIG. 4 depicts a sectional view of the solid-state photomultiplier of FIG. 3.

FIG. 4 depicts a sectional view of the generic SSPM 86 of FIG. 3 along the section 4-4. As illustrated, the photodiodes 90 are implanted over a substrate 96. The implantation may be by diffusion or by doping (implantation of dopants into the substrate) to form pn junctions. A dielectric layer 98 is disposed over the photodiode 90 to provide passivation and electrical insulation. Further, ducts 93 are etched in the dielectric layer 98. Conductors are then deposited in the ducts 93 to provide contacts to the photodiodes 90. The common electrode 92 is deposited over the dielectric layer 98. The quenching resistor 94 is deposited so as to be in contact with the photodiode 90 via the conductive duct 93 and with the common electrode 92. An additional dielectric layer 100 is disposed over the entire structure so as to provide passivation and electrical insulation for the entire structure. It should be noted that a wide variety of dielectric material may be employed for the above purpose. In certain embodiment, the dialect materials employed may be Silicon Oxide ($SiO_2$) having a dielectric constant ($\kappa$) of about 3.9 or Silicon Nitride ($Si_3N_4$) having a dielectric constant ($\kappa$) of about 7.5.

Figure 5:
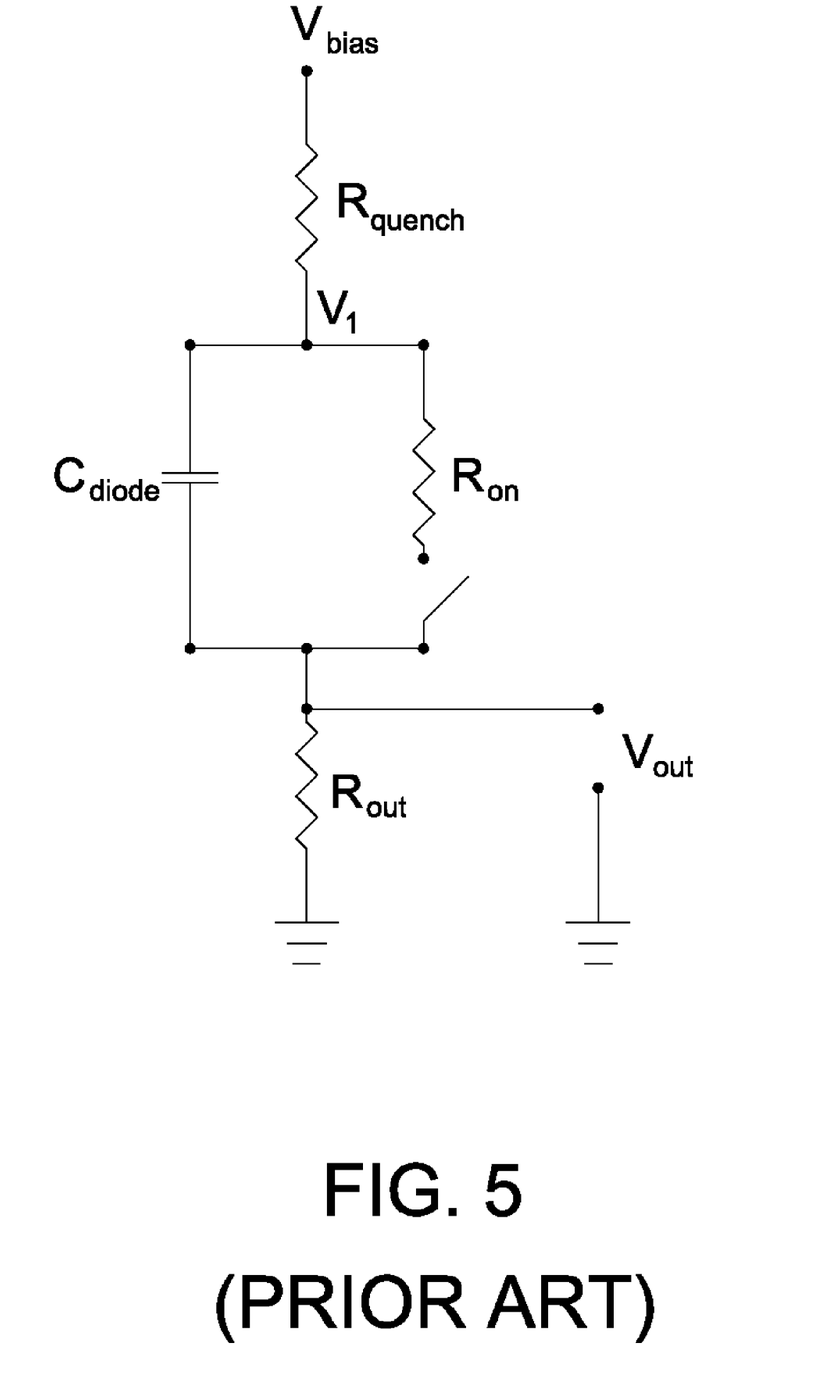
FIG. 5 depicts an equivalent circuit diagram of the solid-state photomultiplier of FIG. 3.

An equivalent circuit diagram of one of the microcells 88 of the SSPM 86 of FIGS. 3 and 4 is illustrated in FIG. 5. As illustrated, the quenching resistor 94 is represented via a resistor Rquench while the photodiode 90 is represented via a capacitor Cdiode and a resistor Ron in parallel. It should be noted that, in certain embodiments, depending on the size of the microcell (also referred to as the pitch of the microcell) and the structure of the diode, Cdiode typically ranges from about 10 femto-Farad (10 fF) to about 600 femto-Farad (600 fF). Ron is typically decoupled from the circuit until the photodiode is in operation in so-called Geiger mode. The input voltage is Vbias while the output voltage is Vout. The output Voltage Vout is read across the output resistor Rout. As previously mentioned, the single-photon response (i.e. impulse response) of the SSPM is approximated by an exponential function, with the decay time given by the RC time constant of the quenching resistor Rquench and the diode capacitance Cdiode. Since these time constants are usually on the order of tens to hundreds of nanoseconds, the single-photon response of an SSPM has a slow decay time. Moreover, since the output electrical signal coming from the PET detector module (SSPM-scintillator combination) is the convolution of the single-photon response and the scintillator light output the slow decay time would cause a slower rising edge of the electric signal, thereby leading to inferior timing resolution. Thus, a fast single-photon response leading to improved timing resolution of the SSPM 82 is desirable for use in variety of application. In particular, improved timing resolution is highly desirable for the time-of-flight (TOF) imaging systems.

As illustrated in FIGS. 6-10, a SSPM 102 in accordance with aspects of the present technique may be configured so as to have fast single-photon response, resulting in improved timing resolution. This may be achieved by coupling an impedance device 104 providing low impedance at high frequency in parallel with the quenching resistor 94 so as to reduce overall quenching impedance for high frequency signal, which is important for better timing resolution. This enables a single-photon response having a fast initial peak as will be described in detail below. In certain embodiments, the low impedance device 104 may be a capacitive device. It should be noted that the value of quenching resistor 94 and the low independence device 104 may be independently optimized for better timing performance. Further, it should be noted that the optimum values of impedance of the low impedance device 104 and resistance of the quenching resistor 94 is typically dependent on the overall photodiode design. Further, it should be noted that the low impedance device 104 may be fabricated and coupled to the quenching resistor 94 in a variety of ways.

Figure 6:
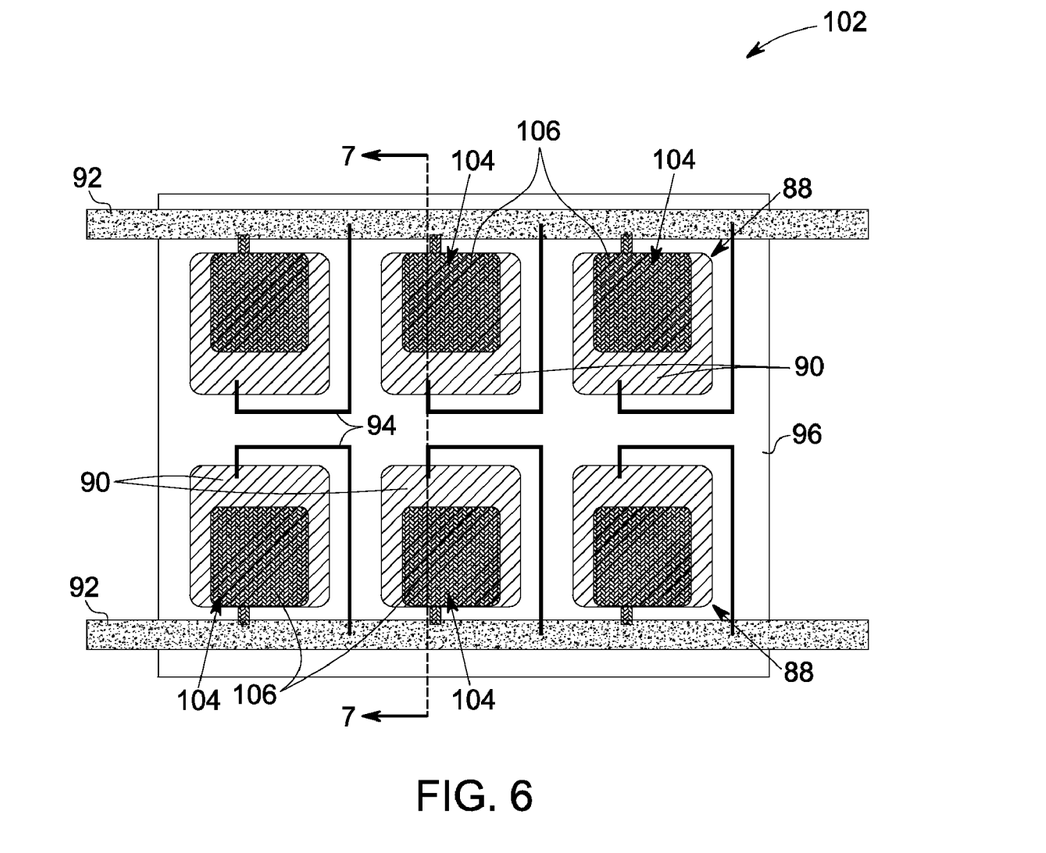
FIG. 6 depicts a top view of a solid-state photomultiplier in accordance with aspects of the present technique.

For example, FIG. 6 illustrates a top view of a SSPM 102 in accordance with one embodiment of the present technique. The low impedance device 104 may be fabricated from an optically transparent or an optically semitransparent material so as to allow impinging photons to pass through and to be detected by the photodiode. The transparent or the semitransparent material may be an indium tin oxide (ITO). As illustrated, the low impedance device 104 is a capacitive device configured such that one of the plates of the capacitive device is the photodiode 90 and the other plate is a transparent or a semitransparent electrode 106 disposed over the photodiode 90 with a layer of dielectric in between. In certain embodiment, the pitch of the microcell may be about 50 micrometer (50 µm) and the pitch of the transparent or the semitransparent electrode 106 plate may be about 30 micrometer (30 µm).

Figure 7:
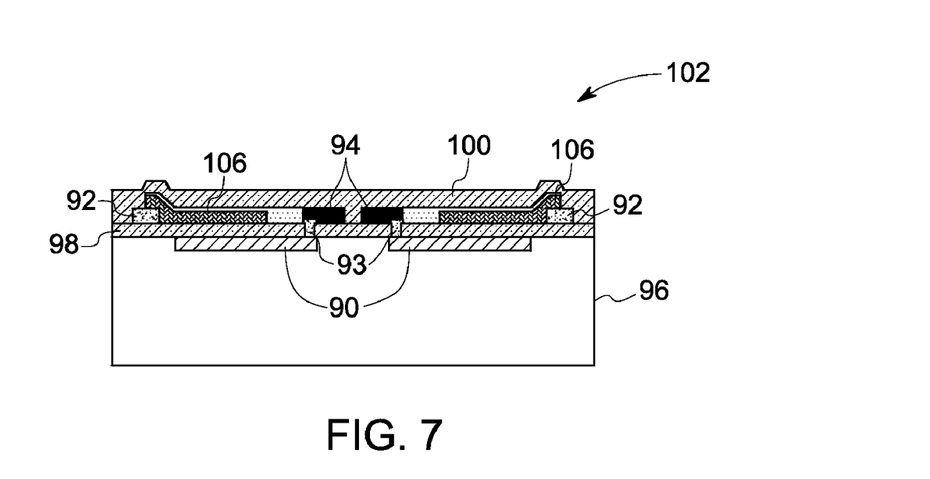
FIG. 7 depicts a sectional view of the solid-state photomultiplier of FIG. 6.

FIG. 7 depicts a sectional view of the SSPM 102 of FIG. 6 along the section 7-7. As illustrated, the photodiodes 90 are implanted over a substrate 96. A dielectric layer 98 is disposed over the photodiode 90 to provide passivation and electrical insulation. The conductive ducts 93 are provided in the dielectric layer 98 to provide contacts to the photodiodes 90. The common electrode 92 is deposited over the dielectric layer 98. The quenching resistor 94 is deposited so as to be in contact with the photodiode 90 via the conductive duct 93 and with the common electrode 92. Further, a layer of optically transparent or semitransparent material 106 is disposed over the dielectric layer 98 such that the photodiode 90, the dielectric material 98, and the optically transparent or semitransparent electrode 106 form the capacitive device. An additional dielectric layer 100 is disposed over the entire structure so as to provide passivation and electrical insulation.

Figure 8:
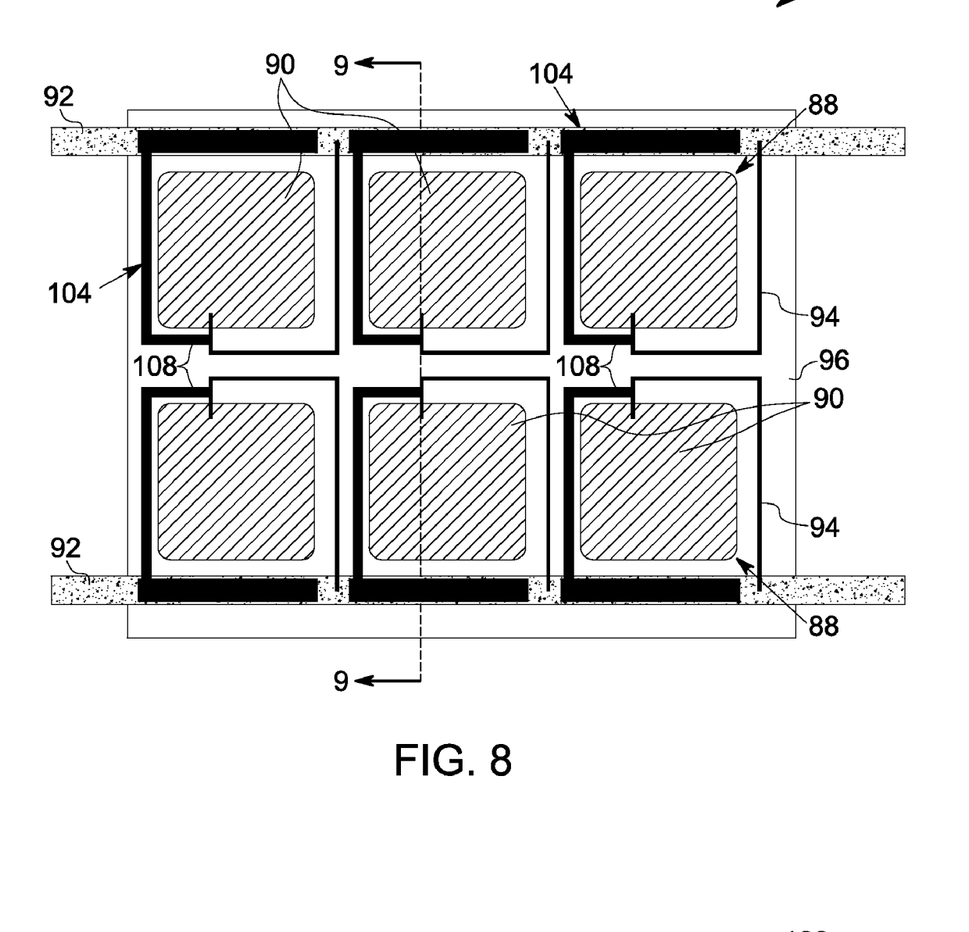
FIG. 8 depicts a top view of a solid-state photomultiplier in accordance with aspects of the present technique.

FIG. 8 illustrates a top view of a SSPM 102 in accordance with another embodiment of the present technique. The low impedance device 104 may be fabricated from an optically non-transparent material and is provided so as not to block the impinging photons from being detected by the photodiode 90. As illustrated, the low impedance device 104 is a capacitive device configured such that one of the plates of the capacitive device is the common electrode 92 and the other plate is a conductive electrode 108 disposed adjacent to the photodiode 90 with a layer of dielectric in between. In certain embodiment, the pitch of the microcell may be about 50 micrometer (50 μm) and the area of the conductive electrode 108 may be about 2 micrometer (2 μm) by about 40 micrometer (40 μm).

Figure 9:
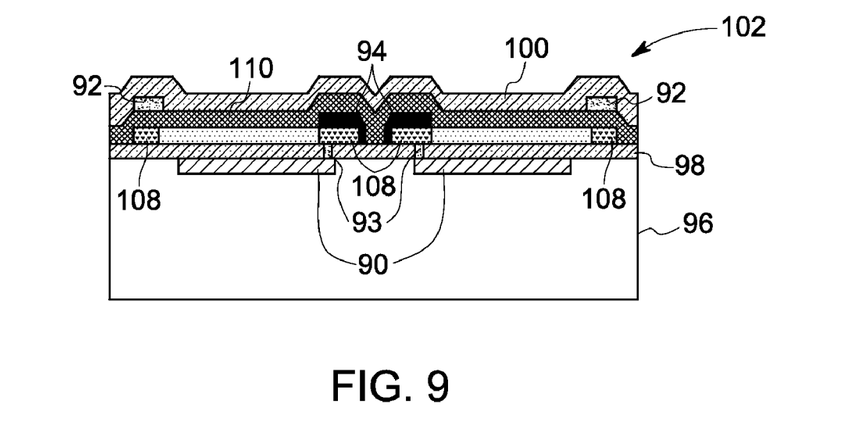
FIG. 9 depicts a sectional view of the solid-state photomultiplier of FIG. 8.

FIG. 9 depicts a sectional view of the SSPM 102 of FIG. 8 along the section 9-9. As illustrated, the photodiodes 90 are implanted over a substrate 96. A dielectric layer 98 is disposed over the photodiode 90 to provide passivation and electrical insulation. The conductive ducts 93 are provided in the dielectric layer 98 to provide contacts to the photodiodes 90. Further, a conductive electrode 108 may be disposed adjacent to the photodiode 90. The quenching resistor 94 is deposited so as to be in contact with the photodiode 90 via the duct 93. A dielectric material 110 is then disposed over the conductive electrode 108. Further, conductive ducts (not shown) are provided in the dielectric layer 110 to provide contacts to the quenching resistors 94. Finally, the common electrode 92 is deposited over the dielectric layer 110 such that the conductive electrode 108, the dielectric material 110, and the common electrode 92 form the capacitive device. It should be noted that the connection between the common electrode 92 and the quenching resistor 94 is through the conductive duct (not shown) in the dielectric layer 110. An additional dielectric layer 100 is disposed over the entire structure so as to provide passivation and electrical insulation.

Figure 10:
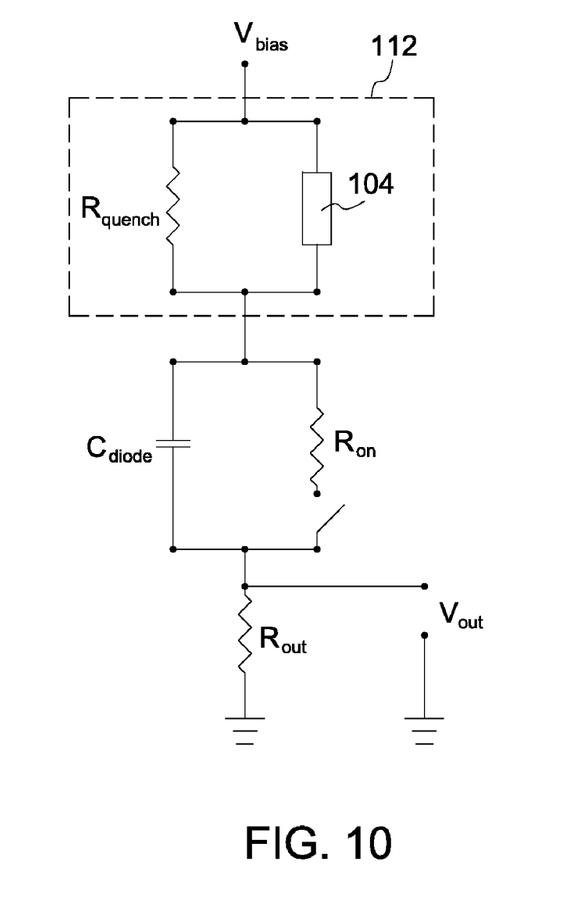
FIGS. 10-11 depict an equivalent circuit diagram of the solid-state photomultiplier of FIGS. 6-9.
Figure 11:
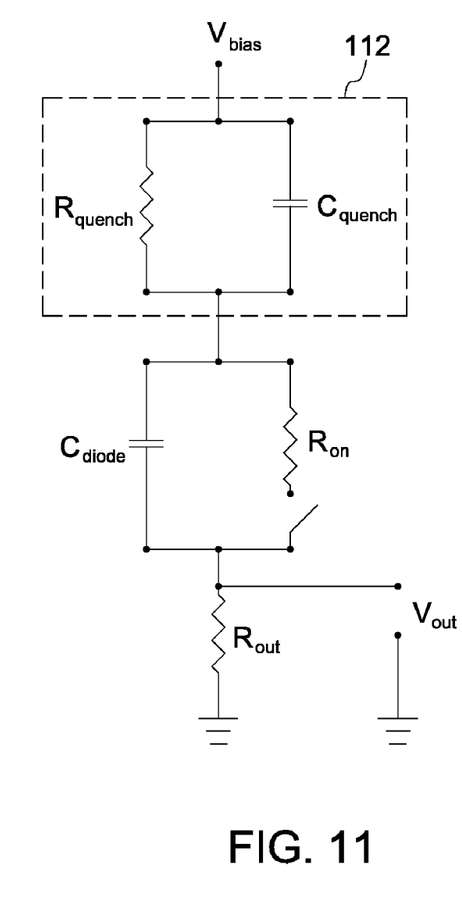

An equivalent circuit diagram of the SSPM of FIGS. 6-9 is illustrated in FIGS. 10 and 11. As noted above with respect to FIG. 5, the quenching resistor 92 is represented via a resistor Rquench while the photodiode 90 is represented via a capacitor Cdiode and a resistor Ron in parallel. Ron is typically decoupled from the circuit until the photodiode is in operation in so-called Geiger mode. The input voltage is Vbias while the output voltage is Vout. The output Voltage Vout is read across the output resistor Rout. Additionally, a low impedance device 104, such as a capacitive device represented via a capacitor Cquench, is coupled in parallel with the quenching resistor Rquench so as to reduce overall quenching impedance of the quenching circuit 112 at high frequency. The capacitance of the capacitive device is generally given by Cquench=$\kappa\epsilon_0$ A/d where κ is the dielectric constant of the dielectric material 98 or 110 separating the parallel plates (the photodiode 90 and the optically transparent or semitransparent electrode 106, or the conductive electrode 108 and the common electrode 92), $\epsilon_0$ is the permittivity constant, A is the area of plates, and d is the separation between the plates. It should be noted that to assure that the probability of pin-holes (which would result in electrical shorts between the plates) is low, a minimum pre-determined separation between the plates may be maintained. In certain embodiments, the minimum pre-determined separation may be about 500-1000 angstrom (1000 Å). Further, in certain embodiments, capacitance of Cquench is typically fabricated or tuned to be about 5% to about 100% of capacitance of Cdiode. It should be noted that the larger values of Cquench result in larger initial pulse amplitudes but also longer recharge (reset) times. The value of capacitance of Cquench may therefore be tuned for optimized timing performance. The low overall quenching impedance of the quenching circuit 112 at high frequency will enhance the high frequency components of the electrical signals. It should be noted that the low impedance device 104, such as the capacitive device represented here by the capacitor Cquench, enables a higher than the normal current or an excess current to initially flow through the cell when the cell begins to avalanche upon absorption of the impinging photons, thereby enabling a single-photon response having a fast initial peak. This provides for a fast single-photon response and thereby an improved timing resolution.

The SSPM design described in the various embodiments discussed above may result in a fast single-photon response (i.e., a single-photon response that has a fast initial peak). The fast initial peak enables the SSPM to have improved timing resolution. It should be noted that a wide variety of imaging systems such as computed tomography (CT), positron emission tomography (PET), single photon emission computed tomography (SPECT), and x-ray imaging may be improved via aspects of the present technique. The techniques for implementing low impedance device with controllable value to the SSPM described in the various embodiments discussed above provide optimized timing resolution. Further, it should be noted that aspects of the present technique may be easily incorporated in the manufacturing of the SSPMs.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A solid-state photomultiplier, comprising:
a plurality of microcells configured to detect impinging photons, each of the plurality of microcells comprising:
a photodiode coupled to a common electrode through a quenching resistor and configured to convert the impinging photons into electrical signals; and
an impedance device coupled in parallel with the quenching resistor so as to reduce overall quenching impedance at high frequency.

2. The solid-state photomultiplier of claim 1, wherein the impedance device is fabricated from an optically transparent or an optically semitransparent material so as to allow the impinging photons to pass through and to be detected by the photodiode.

3. The solid-state photomultiplier of claim 2, wherein the optically transparent or the optically semitransparent material comprises indium tin oxide (ITO).

4. The solid-state photomultiplier of claim 1, wherein the impedance device is fabricated from an optically non-transparent material.

5. The solid-state photomultiplier of claim 4, wherein the impedance device is provided so as not to block the impinging photons from being detected by the photodiode.

6. The solid-state photomultiplier of claim 1, wherein an excess current initially flows through the cell when the cell begins to avalanche upon absorption of the impinging photons.

7. The solid-state photomultiplier of claim 1, wherein the impedance device is a capacitive device.

8. The solid-state photomultiplier of claim 7, wherein one of the plates of the capacitive device is the photodiode and the other plate is an optically transparent or an optically semitransparent electrode disposed over the photodiode.

9. The solid-state photomultiplier of claim 7, wherein one of the plates of the capacitive device is the common electrode and the other plate is a conductive electrode disposed adjacent to the photodiode.

10. The solid-state photomultiplier of claim 7, wherein the capacitance of the capacitive device is optimized for better timing performance based on overall photodiode design.

11. A detector configured to detect radiation, the detector comprising:
a scintillator block comprising one or more scintillator elements for converting the radiation into optical photons; and
a solid-state photomultiplier coupled to the scintillator block and comprising a plurality of microcells configured to detect impinging photons, each of the plurality of microcells comprising:
a photodiode coupled to a common electrode through a quenching resistor and configured to convert the impinging photons into electrical signals; and
an impedance device coupled in parallel with the quenching resistor so as to reduce overall quenching impedance for high frequency electrical signals.

12. The detector of claim 11, wherein the impedance device is fabricated from an optically transparent or an optically semitransparent material so as to allow the impinging photons to pass through and to be detected by the photodiode.

13. The detector of claim 11, wherein the impedance device is fabricated from an optically non-transparent material and is provided so as not to block the impinging photons from being detected by the photodiode.

14. An imaging system, comprising:
an array of detector units disposed around a subject for detecting radiation transmitted through the subject and for generating a detector output signal in response to the detected radiation, the detector unit comprising a scintillator block and a solid-state photomultiplier coupled to the scintillator block, the solid-state photomultiplier comprising a plurality of photodiodes coupled to one or more common electrodes through respective quenching resistors and a plurality of impedance devices coupled in parallel with the respective quenching resistors;
a data acquisition system for acquiring the detector output signal; and
an image reconstructor coupled to the data acquisition system for generating an image signal in response to the detector output signal.

15. The imaging system of claim 14, wherein each of the plurality of impedance devices is a capacitive device.

16. A method of manufacturing a solid-state photomultiplier, the method comprising:
fabricating a plurality of microcells, each microcell comprising a photodiode coupled to a common electrode through a quenching resistor; and
fabricating an impedance device in parallel with the quenching resistor.

17. The method of claim 16, wherein the impedance device is a capacitive device.

18. The method of claim 17, wherein fabricating the capacitive device comprises disposing a dielectric material over the photodiode and disposing an optically transparent or an optically semitransparent electrode over the dielectric material such that the photodiode, the dielectric material, and the optically transparent or the optically semitransparent electrode forms the capacitive device.

19. The method of claim 17, wherein fabricating the capacitive device comprises disposing a conductive electrode adjacent to the photodiode and disposing a dielectric material over the conductive electrode such that the conductive electrode, the dielectric material, and the common electrode forms the capacitive device.

20. A method for imaging a volume, the method comprising:
detecting radiation transmitted through a subject via an array of detector units disposed around the subject, the detector unit comprising a scintillator block and a solid-state photomultiplier coupled to the scintillator block, the solid-state photomultiplier comprising a plurality of photodiodes coupled to one or more common electrodes through respective quenching resistors and a plurality of impedance devices coupled in parallel with the respective quenching resistors;
generating a detector output signal in response to the detected radiation;
acquiring the detector output signal; and
generating an image signal in response to the detector output signal.

* * * * *